United States Patent
Dietze et al.

(10) Patent No.: US 6,184,154 B1
(45) Date of Patent: Feb. 6, 2001

(54) METHOD OF PROCESSING THE BACKSIDE OF A WAFER WITHIN AN EPITAXIAL REACTOR CHAMBER

(75) Inventors: Gerald R. Dietze, Portland, OR (US); Oleg V. Kononchuk, Brush Prairie, WA (US)

(73) Assignee: SEH America, Inc., Vancouver, WA (US)

( * ) Notice: Under 35 U.S.C. 154(b), the term of this patent shall be extended for 0 days.

(21) Appl. No.: 09/417,702

(22) Filed: Oct. 13, 1999

(51) Int. Cl.[7] .......................... H01L 21/31; H01L 21/469
(52) U.S. Cl. .................................................. 438/762
(58) Field of Search ................................. 438/762

(56) References Cited

U.S. PATENT DOCUMENTS

| | | | |
|---|---|---|---|
| 4,687,682 | * | 8/1987 | Koze . |
| 4,962,049 | * | 10/1990 | Chang et al. . |
| 5,834,363 | * | 11/1998 | Masanori . |
| 5,856,240 | * | 1/1999 | Sinha et al. . |
| 5,935,338 | * | 8/1999 | Lei et al. . |

\* cited by examiner

Primary Examiner—John F. Niebling
Assistant Examiner—Josetta Jones
(74) Attorney, Agent, or Firm—Alston & Bird LLP

(57) ABSTRACT

An improved method is provided for processing the backside of a wafer within an epitaxial reactor chamber, such as by etching the backside of the wafer or applying a back seal to the backside of the wafer. The backside of the wafer can therefore be processed within the reactor chamber and an epitaxial layer can then be deposited on the front side of the wafer without ever removing the wafer from the epitaxial reactor chamber. In one embodiment, the backside of the wafer is processed by applying a back seal layer to the backside of the wafer. The back seal layer can be applied by either passing a gas over the backside of the wafer or by setting the wafer upon a sacrificial wafer. In either instance, the gas or the sacrificial wafer reacts with the wafer to grow the back seal layer on the backside of the wafer. In another embodiment, the backside of the wafer is processed by etching the backside of the wafer, such as by passing a reactive gas over the backside of the wafer. Once the backside of the wafer has been processed, such as by applying a back seal layer or by etching the backside of the wafer, an epitaxial layer is deposited on the front side of the wafer without ever removing the wafer from the epitaxial reactor chamber, thereby reducing the cost and fabrication time of the resulting wafers.

16 Claims, 2 Drawing Sheets

METHOD OF PROCESSING THE BACKSIDE OF A WAFER WITHIN AN EPITAXIAL REACTOR CHAMBER

FIELD OF THE INVENTION

The present invention relates generally to methods for processing the backside of a wafer and, more particularly, to methods for either applying a back seal layer to the backside of a wafer or etching the backside of a wafer within an epitaxial reactor chamber.

BACKGROUND OF THE INVENTION

Epitaxial layers having precisely defined electrical and physical properties are oftentimes grown upon the front side of a wafer, such as a silicon wafer, as an initial step in the formation of various devices or circuitry upon the wafer. In order to grow an epitaxial layer, a wafer is typically supported by a susceptor within an epitaxial reactor chamber. After elevating the temperature of the epitaxial reactor chamber, such as to 1050° C. to 1150° C., a gas is introduced into the epitaxial reactor chamber that reacts with the wafer to form the epitaxial layer on the front side of the wafer. For example, in order to grow a monocrystaline silicon layer upon a silicon wafer, a silane-based gas, such as trichlorosilane, is passed over the frontside of the silicon wafer. Once an epitaxial layer of sufficient thickness has been grown on the front side of the wafer, the wafer can be removed from the epitaxial reactor chamber.

Prior to depositing an epitaxial layer on the front side of a wafer, the backside of the wafer, opposite the front side, must oftentimes be processed. For example, the backside of the wafer must sometimes be etched prior to depositing the epitaxial layer on the front side of the wafer. By etching the backside of the wafer prior to the epitaxial deposition, marks, roughened portions and other imperfections can be removed from the backside of the wafer. By way of further example, the backside of the wafer must oftentimes be sealed prior to the epitaxial deposition in order to prevent autodoping. Autodoping generally refers to the release of dopants or contaminants from the backside of the wafer and the subsequent deposition of the released dopant or contaminants on the front side of the wafer during an epitaxial deposition process. In the absence of a back seal on the backside of the wafer, autodoping will generally occur during the epitaxial deposition process since the epitaxial deposition requires that the wafer be processed at such high temperatures. Autodoping is particularly disadvantageous since the dopant and contaminants that are deposited upon the front side of the wafer during the epitaxial deposition process alter the electrical characteristics, such as the resistivity, of the resulting epitaxial layer. In this regard, the dopant and contaminants are generally deposited about the periphery of the front side of the wafer, as opposed to a medial portion of the wafer. Thus, the electrical characteristics of the resulting epitaxial layer generally vary in a radial direction as a result of autodoping. More particularly, autodoping typically causes the resistivity of the resulting epitaxial layer to decrease in a radial direction from the medial portion of the wafer to an edge portion of the wafer since additional dopant is deposited along the edge portion of the wafer as a result of the autodoping. Since most, if not all, applications require that the electrical characteristics of an epitaxial layer be substantially equal or uniform across the entire front side of the wafer, the variations in the electrical properties of the epitaxial layer caused by autodoping are disadvantageous and may cause at least some of the resulting wafers to be scrapped.

In order to avoid autodoping, a back seal is typically applied to the backside of the wafer prior to inserting the wafer into the epitaxial reactor chamber. For example, a polysilicon layer can be grown on the backside of the wafer which significantly limits, if not eliminates, the release of dopant and contaminants from the backside of the wafer and thereby accordingly limits, if not eliminates, the subsequent deposition of the dopant and contaminants upon the front side of the wafer during the epitaxial deposition process.

Unfortunately, the processing of the backside of the wafer must generally be performed prior to inserting the wafer into the epitaxial reactor chamber. As such, a separate fabrication line must be maintained for either etching the backside of the wafer or applying a back seal to the backside of the wafer prior to inserting the wafer into the epitaxial reactor chamber. In order to apply a back seal to the backside of the wafer, the wafer is typically cleaned and then inserted into a furnace or other type of reactor chamber dedicated to growing back seal layers upon the backsides of wafers. As will be apparent, the additional equipment required to process the backside of the wafer prior to the insertion of the wafer in the epitaxial reactor chamber can cost significant amounts of money. For example, it is estimated that the cost of applying a back seal to the backside of a wafer contributes about 15%–20% of the cost of the resulting wafer having an epitaxial layer deposited on the front side thereof. In addition, the various steps that must be undertaken to apply a back seal to the backside of a wafer adds significantly to the overall processing time for the wafer. In this regard, since the wafer must be inserted into different furnaces or reaction chambers in order to apply the back seal to the backside of the wafer and to subsequently deposit the epitaxial layer on the front side of the wafer, the wafer must be repeatedly cleaned, a process that can require a significant amount of time.

Alternatively, reactor chambers have been developed in which the susceptors that support the wafers are coated, such as with polysilicon. Depending upon the wafer the polysilicon coating upon the susceptor and the processing conditions, the wafer can react with the polysilicon coating such that either the backside of the wafer is etched or a back seal layer is grown on the backside of the wafer. Unfortunately, the susceptors must be recoated, such as with polysilicon, on a regular basis, thereby increasing both the costs of the resulting wafers and the processing time required to fabricate the wafers.

Therefore, a need exists to more efficiently process the backside of the wafer prior to depositing an epitaxial layer upon the front side of the wafer. In this regard, while techniques have been developed for etching the backside of the wafer or applying a back seal to the backside of the wafer prior to depositing an epitaxial layer on the front side of the wafer, these techniques generally add significantly to the costs of the resulting wafer and the processing time required to fabricate the wafer. As such, improved techniques are desired for etching the backside of the wafer and applying a back seal to the backside of the wafer prior to depositing an epitaxial layer on the front side of the wafer that are more cost effective and that reduce the overall processing time for the resulting wafers.

SUMMARY OF THE INVENTION

An improved method is therefore provided for processing the backside of a wafer within an epitaxial reactor chamber. such as by etching the backside of the wafer or applying a back seal to the backside of the wafer. As such, the backside of the wafer can be processed within the reactor chamber and an epitaxial layer can then be deposited on the front side of the wafer without ever removing the wafer from the epitaxial reactor chamber. As such, the same equipment, i.e., the epitaxial reactor chamber, can be used to both process the backside of the wafer and deposit the epitaxial layer on the front side of the wafer. Thus, the method of the present invention should reduce the costs of the resulting wafers. In addition, by permitting the wafer to remain within the same reactor chamber during both the processing of the backside of the wafer and the deposition of the epitaxial layer on the front side of the wafer, the wafer need not be repeatedly cleaned, thereby reducing the processing time for fabricating a wafer having an epitaxial layer deposited on the front side thereof.

Initially, the wafer is inserted into the epitaxial reactor chamber. According to the method of one embodiment, a back seal layer is then applied to the backside of the wafer within the epitaxial reactor chamber. Once a back seal layer has been applied to the backside of the wafer, an epitaxial layer is deposited on the front side of the wafer without ever removing the wafer from the epitaxial reactor chamber.

In applying a back seal layer to the backside of the wafer, according to this embodiment, a gas is typically passed over the backside of the wafer such that the back seal layer grows on the backside of the wafer as a result of a reaction of the gas with the wafer. For example, the wafer may be a silicon wafer and a silane-based gas can be passed over the backside of the wafer so as to grow a polysilicon back seal layer on the backside of the wafer. Alternatively, the back seal layer can be grown on the backside of the wafer by supporting the wafer upon a sacrificial wafer within the epitaxial reactor chamber. In this embodiment, the epitaxial reactor chamber can be heated in order to grow the back seal layer on the backside of the wafer, such as by recrystalization of a portion of the sacrificial wafer upon the backside of the wafer so as to form the back seal layer. For example, a silicon wafer can be supported upon a silicon sacrificial wafer such that a polysilicon layer grows upon the backside of the wafer once the temperature of the epitaxial reactor chamber is elevated.

Instead of growing a back seal layer on the backside of the wafer, the backside of the wafer can be processed according to another embodiment of the method of the present invention by etching the backside of the wafer. In this embodiment, a gas is again passed over the backside of the wafer while the wafer is disposed within the epitaxial reactor chamber. As a result of the reaction of the gas with the wafer, the backside of the wafer is etched. Thereafter, an epitaxial layer can be deposited on the front side of the wafer without ever removing the wafer from the epitaxial reactor chamber.

The wafer is typically supported upon a susceptor within the epitaxial reactor chamber. In the embodiments of the method of the present invention in which a gas is passed over the backside of the wafer, such as in instances in which the back seal layer is grown on the backside of the wafer as a result of a reaction of the gas with the wafer and in instances in which the backside of the wafer is etched as a result of a reaction of the gas with the wafer, the susceptor that supports the wafer within the epitaxial reactor chamber preferably includes a plurality of outwardly extending pins. As such, the wafer is supported upon the plurality of pins to thereby define a passage between the backside of the wafer and the remainder of the susceptor. The susceptor of this advantageous embodiment can also include at least one gas inlet port such that gas can be passed over the backside of the wafer by injecting gas through the gas inlet port defined by the susceptor. The gas then flows through the passage defined between the backside of the wafer and the remainder of the susceptor. While flowing through the passage defined by the backside of the wafer and the remainder of the susceptor, the gas reacts with the wafer so as to grow a back seal layer on the backside of the wafer or to etch the backside of the wafer. Once the backside of the wafer has been appropriately processed, an epitaxial layer can be deposited on the front side of the wafer without ever removing the wafer from the epitaxial reactor chamber.

The method of the present invention therefore provides a cost effective and efficient technique for processing the backside of a wafer within an epitaxial reactor chamber. As such, the backside of a wafer can be processed within an epitaxial reactor chamber and an epitaxial layer can then be deposited on the front side of the wafer without ever removing the wafer from the epitaxial reactor chamber. For example, a back seal layer can be applied to the backside of the wafer or the backside of the wafer can be etched within the epitaxial reactor chamber prior to depositing the epitaxial layer on the front side of the wafer without ever removing the wafer from the epitaxial reactor chamber. Thus, separate furnaces or reactor chambers are not required for processing the backside of the wafer and for depositing the epitaxial layer on the front side of the wafer, thereby reducing the costs of the resulting wafers. Since the wafers remain within the same epitaxial reactor chamber while the backside of the wafer is processed and while the epitaxial layer is deposited on the front side of the wafer, the wafer need not be cleaned as many times as in conventional fabrication processes that require separate furnaces or reaction chambers for the processing of the backside of the wafer and the deposition of the epitaxial layer on the front side of the wafer, thereby reducing the overall time required for fabricating the epitaxial wafer.

DETAILED DESCRIPTION OF THE INVENTION

Figure 1:
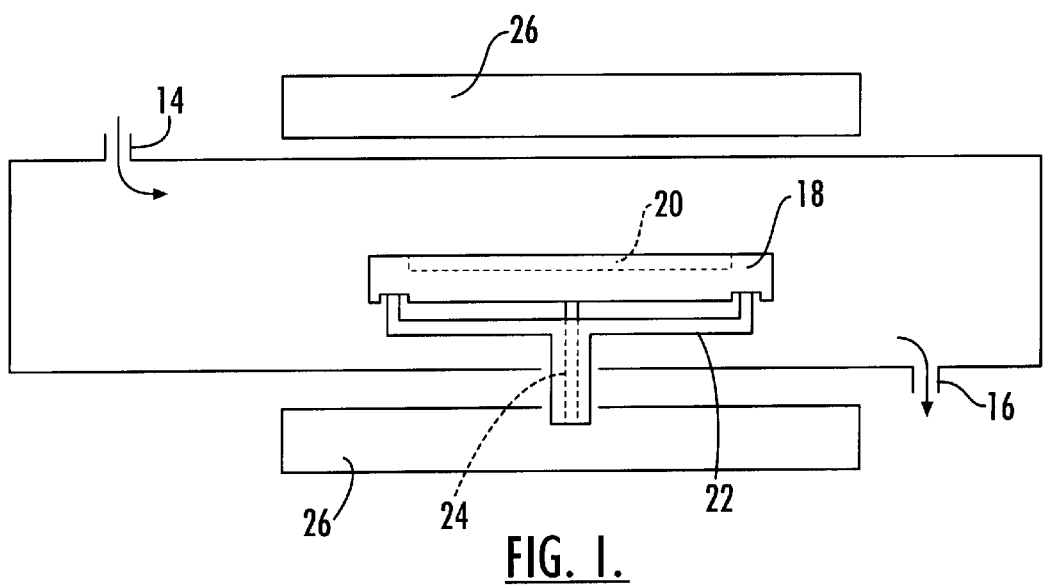
FIG. 1 is a side view of an epitaxial reactor chamber in which a wafer is processed according to the method of one embodiment to the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

According to the method of the present invention, the backside 10a of a wafer 10, such as a silicon wafer, is processed within an epitaxial reactor chamber 11 prior to or, in some embodiments, concurrent with the deposition of an epitaxial layer 12 on the front side 10b of the wafer without ever having to remove the wafer from the epitaxial reactor chamber. For example, a back seal layer 13, such as a polysilicon back seal, can be applied to the backside of the wafer in the epitaxial reactor chamber prior to or concurrent with the deposition of the epitaxial layer, such as a monocrystalline layer, on the front side of the wafer. Alternatively, the backside of the wafer can be etched in the epitaxial reactor chamber prior to depositing the epitaxial layer on the front side of the wafer.

Regardless of the manner in which the backside 10a of the wafer 10 is to be processed, the wafer is initially inserted into an epitaxial reactor chamber 11. Although the method of the present invention is particularly advantageous with respect to the processing of the backside of a silicon wafer, the method of the present invention can be utilized with wafers, also referred to as prime wafers, formed of a variety of materials without departing from the spirit and scope of the present invention. In addition, the wafer can be inserted into a variety of different epitaxial reactor chambers. As shown in FIG. 1, however, the epitaxial reactor chamber is typically a horizontal-type of reactor chamber. By way of example, the epitaxial reactor chamber of one advantageous embodiment is one of the Epsilon family of single-wafer epitaxial reactors provided by ASM International N.V., such as the Epsilon 2000 epitaxial reactor, the Epsilon 2500 epitaxial reactor or the Epsilon 3000 epitaxial reactor. While the epitaxial reactor chamber is typically designed to receive and process a single wafer at a time, the epitaxial reactor chamber can be adapted to receive multiple wafers, if so desired.

Figure 2:
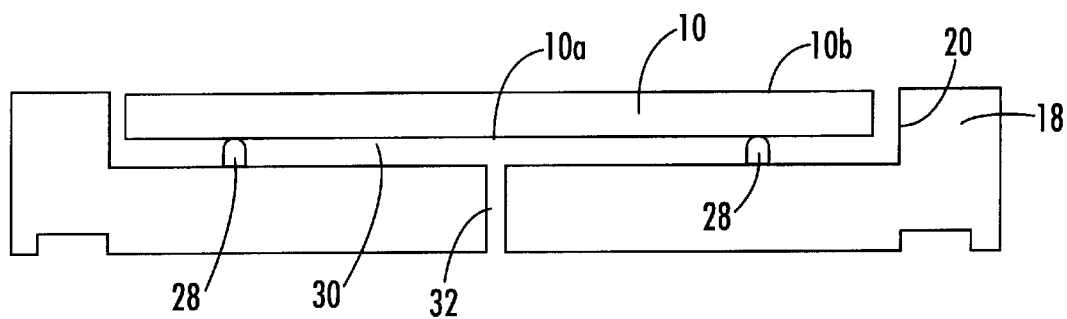
FIG. 2 is a more detailed side view of a susceptor supporting a wafer during the processing of the backside of the wafer within the epitaxial reactor chamber of FIG. 1 according to one embodiment of the method of the present invention.

As shown in FIG. 1, the epitaxial reactor chamber 11 generally defines a sealed chamber into which gases can be selectively introduced via at least one gas inlet 14 and removed via at least one gas exhaust 16. The epitaxial reactor chamber also generally includes a susceptor assembly including a susceptor 18, typically formed of graphite, for supporting the prime wafer 10 that is inserted into the epitaxial reactor chamber for processing therein. As shown in FIG. 2, the susceptor generally includes a recess or a depression 20 in which the wafer is disposed. In addition to the susceptor, the susceptor assembly of an expitaxial reactor chamber can include a susceptor support 22, typically formed of quartz, for rotatably supportinig the susceptor. In this regard, the susceptor assembly also generally includes a shaft 24 sealably extending through a wall of the reactor chamber for engaging the susceptor support. The shaft is typically formed of the same material as the susceptor support, such as quartz, and is adapted to be rotated such that the susceptor support and, in turn, the susceptor as well as the wafer carried by the susceptor, can be rotated in order to effect a more even or uniform epitaxial deposition upon the wafer. Although not necessary for the present invention, the susceptor assembly can also include a temperature sensor or thermocouple that typically extends through or along the shaft and into the susceptor so as to monitor the temperature of the susceptor and to indirectly monitor the temperature of the wafer supported by the susceptor.

Although a variety of susceptors 18 can be utilized in accordance with the method of the present invention, the susceptor utilized in conjunction with one advantageous embodiment of the method of the present invention is a susceptor having a purge capability, such as a pinned or purged susceptor that is provided by Xycarb Ceramics. For example, one suitable susceptor provided by Xycarb Ceramics bears part number 04-330888-08. As also described hereinbelow, however, other embodiments of the method of the present invention can utilize more conventional susceptors that do not have a purge capability, if so desired.

After the wafer 10 has been inserted into the epitaxial reactor chamber 11, typically by means of an automated wafer-loading mechanism, such as provided by the Epsilon 2000 epitaxial reactor, the epitaxial reactor chamber is typically purged, such as with $H_2$ or $N_2$. Thereinafter, the backside 10a of the wafer is processed within the epitaxial reactor chamber so as to modify the backside of the wafer. In one advantageous embodiment, the backside of the wafer is processed by applying a back seal layer 13 to the backside of the wafer. In this regard, gas is introduced into the epitaxial reactor chamber so as to pass over the backside of the wafer. As a result of the reaction of the gas with the wafer, a back seal layer is grown on the backside of the wafer. In instances in which a back seal layer is applied to a silicon wafer, a gaseous source of silicon, such as a silane-based gas, i.e., trichlorosilane, is passed over the backside of the wafer such that a silicon layer is grown on the backside of the wafer. Since polycrystalline silicon provides greater sealing capabilities than monocrystalline silicon, the backside of the wafer is (generally configured, such as by being unpolished or even sandblasted, so as to support the growth of polysilicon as the silane-based gas is passed over the backside of the wafer. In addition to merely passing gas over the backside of the wafer, the wafer is preferably heated while the gas is introduced into the epitaxial reactor chamber. For example, the epitaxial reactor chamber can include a heater, such as an array of infrared heater elements 26 disposed on opposite sides of the reactor chamber as shown schematically in FIG. 1, in order to appropriately heat the epitaxial reactor chamber as well as the wafer disposed therein, such as to between about 1050° C. and 1150° C.

In order to uniformly deposit a back seal layer 13 on the backside 10a of the wafer 10, the temperature of the wafer must remain substantially constant and the flow of the gas over the backside of the wafer must remain consistent. In order to obtain consistent gas flow over the backside of the wafer, the epitaxial reactor chamber 11 of one advantageous embodiment includes a susceptor 18 with purge capability as shown in more detail in FIG. 2. In this embodiment, the susceptor is designed such that the wafer is supported slightly above the body of the susceptor. For example, the susceptor can include a number of pins 28 extending outwardly from the body of the susceptor into the recess 20 defined by the susceptor. As such, the wafer is supported upon the pins and spaced from the body of the susceptor such that a passage 30 is defined between the backside of the wafer and the body or the remainder of the susceptor. Since the pins that extend outwardly from the body of the susceptor will cause those portions of the wafer in contact with the pins to be heated somewhat differently than the remainder of the wafer, the pins are preferably quite small and generally have a rounded distal end such that approximate point contact is established with the wafer without scratching the wafer. As mentioned above, one acceptable susceptor having purge capability is provided by Xycarb Ceramics.

A susceptor 18 with purge capability also includes at least one gas inlet port 32 through which a gas in injected into the passage 30 defined between the backside 10*a* of the wafer 10 and the body of the susceptor. Conventionally, purge gases, such as $H_2$ and $N_2$, have been injected via the gas inlet port defined by the susceptor. According to the present invention, however, the gas that will react with the wafer to grow the back seal layer 13 on the backside of the wafer is injected via the gas inlet port defined by the susceptor. For example, trichlorosilane can be injected via the gas inlet port defined by the susceptor. In order to promote uniform flow of gas over the backside of the wafer, the susceptor of one advantageous embodiment defines a gas inlet port that extends through the rotation shaft 24 and through the center of the susceptor support 22 and the susceptor so as to be introduced at a position substantially aligned with the center of the wafer. However, the susceptor can define a plurality of gas inlet ports disposed at a variety of other locations, if so desired.

Figure 3:
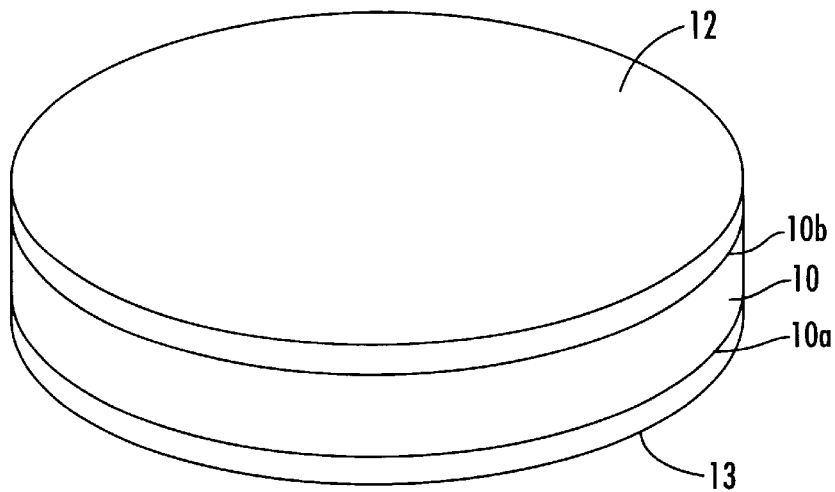
FIG. 3 is a side cross-sectional view of a wafer having an epitaxial layer on the front side of the wafer and a back seal layer on the backside of the wafer, such as produced by the method of one embodiment of the present invention.

By appropriately controlling the flow of gas over the backside 10*a* of the wafer as well as the temperature of the wafer and the length of time for which gas passes over the backside of the wafer, a back seal layer 13 of the desired thickness can be controllably grown on the backside of the wafer. Thereafter, the flow of gas containing a silicon source can be halted and the epitaxial reactor chamber 18 can be purged, such as by introducing $H_2$ or $N_2$ via the main gas inlet 14 and, in some instances, also via the gas inlet port 32 defined by the susceptor 18. Once the epitaxial reactor chamber has been purged, an epitaxial layer 12 can be deposited upon the front side 10*b* of the wafer to produce the wafer depicted in FIG. 3 without ever removing the wafer from the epitaxial reactor chamber after having grown the back seal layer on the backside of the wafer. In one embodiment in which a monocrystalline silicon epitaxial layer is to be deposited upon the front side of a silicon wafer, a mixture of gases, such as a silane-based gas, i.e. chlorosilane, dichlorosilane, trichlorosilane or tetrachlorosilane, hydrogen and a dopant, such as boron or phosphorous, is introduced into the epitaxial reactor chamber while the wafer remains heated to about 1050° C. to 1150° C. By controlling the mixture of the gases, the temperature of the wafer and the duration for which the mixture of gases is passed over the front side of the wafer, an epitaxial layer of the desired composition and thickness can be deposited upon the front side of the wafer. Thereafter, the flow of the reactive gases and/or the product of the reactive gases can be halted, the epitaxial reactor chamber can be purged with hydrogen and the wafer can be cooled. The wafer having an epitaxial layer deposited on the front side and a back seal layer grown on the backside can then be removed from the epitaxial reactor chamber and the back seal layer can be removed, if so desired. By applying a back seal layer to the backside of the wafer prior to depositing the epitaxial layer, however, autodoping of the epitaxial layer is significantly reduced, if not eliminated, since dopant, such as boron, and other containments cannot be released through the backside of the wafer so as to be redeposited upon the front side of the wafer during the epitaxial deposition process. Alternatively, the back seal layer can be grown on the backside of the wafer concurrent with the depositing of the epitaxial layer, if so desired.

By utilizing the same epitaxial reactor chamber 11 for both the application of the back seal layer 13 and the deposition of the epitaxial layer 12, separate equipment, such as a separate furnace or reactor chamber, need not be purchased in order to first apply the back seal layer prior to introducing the back seal wafer into the epitaxial reactor chamber. As such, the cost of the resulting wafers should be accordingly reduced. Additionally, by reducing the handling of the wafers since the wafers remain within the same reactor chamber while applying both the back seal layer and the epitaxial layer, the wafer need not be cleaned as frequently. In fact, the wafer is typically cleaned prior to being introduced into the epitaxial reactor chamber, but is not generally cleaned again after the back seal layer has been applied and prior to depositing the epitaxial layer since the wafer remains within the same epitaxial reactor chamber and is not handled or otherwise exposed to contaminants. As such, the cost of the resulting wafers should be accordingly reduced as well as the time required to fabricate the wafers relative to conventional techniques that require separate lines for applying the back seal layer and for depositing the epitaxial layer on the wafer.

In addition to or instead of applying a back seal layer 13 to the wafer 10, the backside 10*a* of the wafer can otherwise be processed within the epitaxial reactor chamber 11 prior to depositing the epitaxial layer 12 on the front side 10*b* of the wafer. For example, in embodiments in which the wafer is inserted into the epitaxial reactor chamber and supported on the pins 28 of a susceptor 18 having purge capability as depicted in FIG. 2, the backside of the wafer can be etched prior to depositing the epitaxial layer on the front side of the wafer. In this regard, a gaseous etchant is introduced into the passage 30 defined between the wafer and the body of the susceptor via the gas inlet port 32 defined by the susceptor while the wafer is heated, such as to between about 1120° C. and 1170° C. The gaseous etchant reacts with the backside of the wafer so as to consume and remove a portion of the backside of the wafer, thereby etching the backside of the wafer. While a variety of gaseous etchants can be utilized depending upon the type of wafer, hydrogen chloride is utilized to etch the backside of a silicon wafer. By controlling the flow of the gas over the backside of the wafer, the concentration of the gas as well as the temperature of the wafer and the duration for which the gas flows over the backside of the wafer, the extent of the etching of the backside of the wafer can be precisely controlled.

Once the backside 10*a* of the wafer 10 has been appropriately etched, the flow of gaseous etchant is halted and the epitaxial reactor chamber 11 is purged, such as with $H_2$ or $N_2$. Thereafter, an epitaxial layer 12 can be deposited on the front side 10*b* of the wafer as described above prior to removing the wafer from the epitaxial reactor chamber. As also described above, this embodiment of the method of the present invention permits the wafer to remain within the same epitaxial reactor chamber while the backside of the wafer is initially etched and an epitaxial layer is thereafter deposited on the front side of the wafer. As a result, less equipment is required in comparison with conventional techniques that require separate reaction chambers for etching the backside of the wafer and then depositing an epitaxial layer on the front side of the wafer. In addition, the processing time should be reduced since the wafer is handled fewer times and, therefore, need not be cleaned as frequently.

Figure 4:
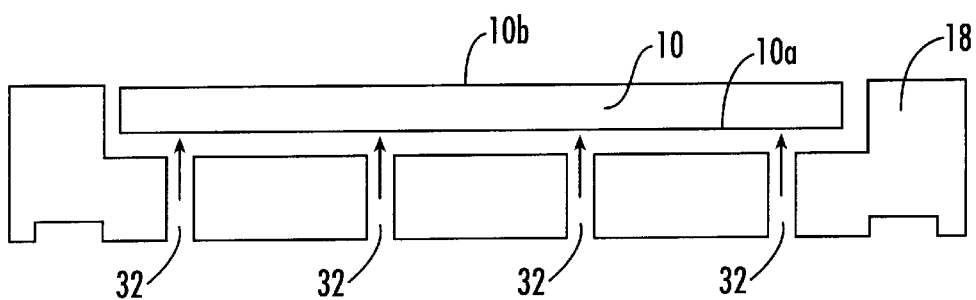
FIG. 4 is a side view of a susceptor that defines a plurality of gas inlet ports for suspending a wafer slightly above the susceptor.

As shown in FIG. 4, the susceptor 18 need not have a plurality of pins for supporting the wafer 10. Instead, the susceptor can incorporate other means for supporting the wafer above the surface of the susceptor. For example, the susceptor of FIG. 4 defines a plurality of gas inlet ports 32 through which a reactive gas is introduced. By appropriately controlling the flow rate of the gas, the wafer can be suspended above the surface of the susceptor while a back seal layer 13 is applied or while the backside 10a of the wafer is etched, as described above. In addition, by decreasing the temperature or by increasing the flow rate of the reactive gas, nozzle marks on the backside of the wafer can be reduced. In other words, differences in the processing of the backside of the wafer for those regions of the backside that are aligned with the gas inlet ports relative to other regions of the backside can be reduced.

Figure 5:
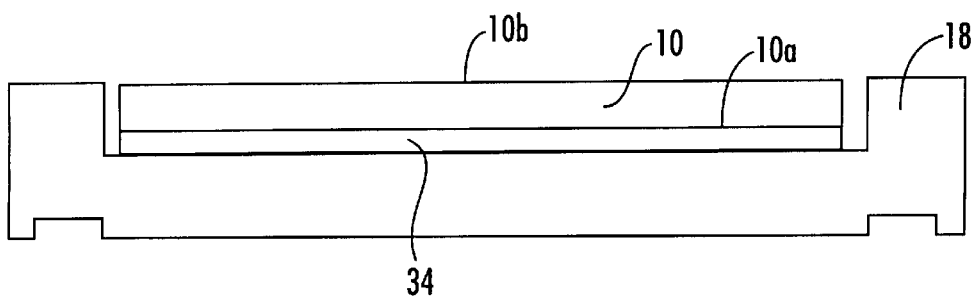
FIG. 5 is a side view of a susceptor within an epitaxial reactor chamber for supporting both a sacrificial wafer and a prime wafer such that the backside of the prime wafer can be processed according to another embodiment of the method of the present invention.

While the method of one advantageous embodiment supports the wafer 10 with a susceptor 18 having purge capability in order to permit gases to be introduced into the passage 30 defined between the backside 10a of the wafer and the body of the susceptor as described above, the backside of the wafer can be processed according to the method of the present invention while being supported by other types of susceptors, if so desired. As shown in FIG. 5, for example, the wafer can be supported within a more conventional susceptor that does not have purge capability and therefore does not define one or more inlet ports through which gas can be introduced. However, the backside of the wafer can still be processed, such as by applying a back seal layer 13, as described hereinbelow.

In this embodiment depicted in FIG. 5, a sacrificial wafer 34 can be supported by the susceptor 18, such was within the recess 20 defined by the susceptor, and the prime wafer 10, i.e. the wafer upon which an epitaxial layer 12 is to be deposited, can be set upon and supported by the sacrificial wafer. The sacrificial wafer generally has a diameter at least as large as the diameter as the prime wafer and is formed of a material that will, in turn, form the back seal layer 13. For a silicon prime wafer, for example, the sacrificial wafer is typically formed of silicon, albeit with a much smaller concentration of dopant than the prime wafer such that a polycrystalline silicon back seal layer can be applied to the backside 10a of the silicon prime wafer as described below. In one advantageous embodiment, for example, the sacrificial wafer is formed of silicon having a dopant concentration of no more than $10^{15}$ atoms/cm$^3$ corresponding resistivity of between 1 and 10 Ω·cm such that the resulting polysilicon back seal layer also has a dopant concentration of no more than $10^{15}$ atoms/cm$^3$. In addition, the sacrificial wafer need not be polished or otherwise be of the same quality as a prime wafer.

In operation, the epitaxial reactor chamber 11 including both the prime wafer 10 and the sacrificial wafer 34 is heated, such as to between about 1050° C. and about 1150° C. At this temperature, the silicon can recrystallize such that silicon from the sacrificial wafer recrystallizes upon the backside 10a of the prime wafer to form a polycrystalline back seal layer 13. By controlling the temperature of the epitaxial reactor chamber and the length of time for which the epitaxial reactor chamber is maintained at the elevated temperature, a back seal layer of a desired thickness can be controllably applied. Once the appropriate back seal layer has been applied, the epitaxial reactor chamber is purged, such as with $H_2$ or $N_2$. Thereafter, the epitaxial reactor chamber is again heated and a gaseous mixture is introduced into the epitaxial reactor chamber, such as via the main gas inlet 14, in order to deposit an epitaxial layer on the front side 10b of the wafer. Since the backside of the wafer is sealed with the back seal layer, however, the epitaxial layer is not autodoped since very little, if any, dopant or contaminants are released via the backside of the wafer so as to be deposited upon the front side of the wafer along with the epitaxial layer. Once the desired epitaxial layer has been deposited, the epitaxial deposition process can be halted and the wafer can be removed from the reactor chamber as described above.

Regardless of the type of processing of the backside 10a of the wafer 10. such as the application of a back seal layer 13 or the etching of the backside of the wafer, the processing of the backside of the wafer and the deposition of an epitaxial layer 12 on the front side 10b of the wafer can be conducted in the same epitaxial reactor chamber 11. As such, the capital costs associated with the fabrication of wafers should be decreased relative to conventional techniques that require separate lines for processing the backside of the wafer prior to introducing the wafer into the epitaxial reactor chamber for the deposition of the epitaxial layer. In addition, the time required to fabricate wafers according to the present invention should be diminished relative to conventional techniques that require separate lines since the wafer remains within the same epitaxial reactor chamber and is not handled as frequently, thereby not exposing the wafer to as many contaminants and not requiring the wafer to be cleaned as frequently. Thus, the cost of the resulting wafers should also be less than wafers fabricated according to conventional techniques that require separate lines for processing the backside of the wafers prior to depositing the epitaxial layer on the front side of the wafers.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A method for applying a back seal layer to a backside of a wafer within an epitaxial reactor chamber, the method comprising:

passing a gas over the backside of the wafer within the epitaxial reactor chamber;

growing the back seal layer on the backside of the wafer as a result of a reaction of the gas with the wafer; and depositing an epitaxial layer on a front side of the wafer, opposite the backside, without removing the wafer from the epitaxial reactor chamber.

2. A method according to claim 1 further comprising:

inserting the wafer into the epitaxial reactor chamber; and supporting the wafer upon a susceptor within the epitaxial reactor chamber such that the backside of the wafer faces the susceptor, wherein the susceptor includes a plurality of outwardly extending pins such that supporting the wafer comprises supporting the wafer upon the plurality of pins to thereby define a passage between the backside of the wafer and the remainder of the susceptor.

3. A method according to claim 2 wherein the susceptor defines at least one gas inlet port, and wherein passing the gas over the backside of the wafer comprises injecting gas through the at least one gas inlet port defined by the susceptor so as to flow through the passage defined between the backside of the wafer and the remainder of the susceptor.

4. A method according to claim 1 further comprising:

inserting the wafer into the epitaxial wafer chamber; and supporting the wafer above a susceptor such that the backside of the wafer faces the susceptor and a passage is defined between the backside of the wafer and the susceptor, wherein the susceptor defines a plurality of gas inlet ports, and wherein said supporting step comprises injecting gas through the plurality of gas inlet ports defined by the susceptor to thereby suspend the wafer above the susceptor while the back seal layer is grown on the backside of the wafer.

5. A method according to claim 1 further comprising purging the epitaxial reactor chamber after growing the back seal layer on the backside of the wafer and prior to depositing the epitaxial layer on the front side of the wafer.

6. A method according to claim 1 wherein the wafer is a silicon wafer, wherein passing the gas over the backside of the wafer comprises passing a silane-based gas over the backside of the wafer, and wherein growing the back seal layer comprises growing a polysilicon back seal layer on the backside of the wafer.

7. A method of processing a backside of a wafer within an epitaxial reactor chamber, the method comprising:

passing a gas over the backside of the wafer within the epitaxial reactor chamber;

etching the backside of the wafer as a result of a reaction of the gas with the wafer; and depositing an epitaxial layer on a front side of the wafer, opposite the backside, without removing the wafer from the epitaxial reactor chamber.

8. A method according to claim 7 wherein processing the backside of the wafer comprises:

inserting the wafer into the epitaxial reactor chamber; and supporting the wafer upon a susceptor within the epitaxial reactor chamber such that the backside of the wafer faces the susceptor while the backside of the wafer is etched and the epitaxial layer is deposited on the front side of the wafer.

9. A method according to claim 8 wherein the susceptor includes a plurality of outwardly extending pins such that supporting the wafer comprises supporting the wafer upon the plurality of pins so that the backside of the wafer faces the susceptor to thereby define a passage between the backside of the wafer and the remainder of the susceptor.

10. A method according to claim 9 wherein the susceptor defines at least one gas inlet port, and wherein passing the gas over the backside of the wafer comprises injecting gas through the at least one gas inlet port defined by the susceptor so as to flow through the passage defined between the backside of the wafer and the remainder of the susceptor.

11. A method according to claim 7 further comprising:

inserting the wafer into the epitaxial wafer chamber; and supporting the wafer above a susceptor such that the backside of the wafer faces the susceptor and a passage is defined between the backside of the wafer and the susceptor, wherein the susceptor defines a plurality of gas inlet ports, and wherein said supporting step comprises injecting gas through the plurality of gas inlet ports defined by the susceptor to thereby suspend the wafer above the susceptor while the backside of the wafer is etched.

12. A method according to claim 6 further comprising purging the epitaxial reactor chamber after etching the backside of the wafer and prior to depositing the epitaxial layer on the front side of the wafer.

13. A method for applying a back seal layer to a backside of a prime wafer within an epitaxial reactor chamber, the method comprising:

supporting the prime wafer upon a sacrificial wafer within the epitaxial reactor chamber;

heating the epitaxial reactor chamber to thereby grow the back seal layer on the backside of the wafer; and depositing an epitaxial layer on a front side of the wafer, opposite the backside, without removing the wafer from the epitaxial reactor chamber.

14. A method according to claim 13 further comprising:

inserting the prime wafer into the epitaxial reactor chamber; and placing the prime wafer upon the sacrificial wafer which thereafter supports the prime wafer during growth of the back seal layer and deposition of the epitaxial layer, wherein the prime wafer is placed on the sacrificial wafer such that the backside of the prime wafer faces the sacrificial wafer.

15. A method according to claim 13 wherein the prime wafer and the sacrificial wafer are silicon wafers such that heating the epitaxial reactor chamber causes a polysilicon back seal layer to grow on the backside of the wafer.

16. A method according to claim 13 further comprising purging the epitaxial reactor chamber after etching the backside of the wafer and prior to depositing the epitaxial layer on the front side of the wafer.

* * * * *